(12) United States Patent
Erickson et al.

(10) Patent No.: US 8,816,470 B2
(45) Date of Patent: *Aug. 26, 2014

(54) INDEPENDENTLY VOLTAGE CONTROLLED VOLUME OF SILICON ON A SILICON ON INSULATOR CHIP

(75) Inventors: Karl R. Erickson, Rochester, MN (US); Phil C. Paone, Rochester, MN (US); David P. Paulsen, Dodge Center, MN (US); John E. Sheets, II, Zumbrota, MN (US); Gregory J. Uhlmann, Rochester, MN (US); Kelly L. Williams, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/091,275

(22) Filed: Apr. 21, 2011

(65) Prior Publication Data

US 2012/0267752 A1    Oct. 25, 2012

(51) Int. Cl.
*H01L 29/06*    (2006.01)
*H01L 21/762*    (2006.01)

(52) U.S. Cl.
USPC 257/510; 438/404; 257/E29.02; 257/E21.545

(58) Field of Classification Search
USPC .............. 257/510, E29.02, E21.545; 438/404
See application file for complete search history.

(56) References Cited

U.S. PATENT DOCUMENTS

| | | |
|---|---|---|
| 6,087,690 A | 7/2000 | Chi |
| 6,260,172 B1 | 7/2001 | Hazama |
| 6,330,648 B1 | 12/2001 | Wambach et al. |
| 6,429,477 B1 | 8/2002 | Mandelman et al. |
| 6,438,059 B2 | 8/2002 | Akita et al. |
| 6,821,857 B1 | 11/2004 | Khan et al. |
| 7,080,001 B2 | 7/2006 | Moriyama et al. |
| 7,115,950 B2 | 10/2006 | Tokushige |
| 7,208,798 B2 | 4/2007 | Baba |
| 7,394,708 B1 | 7/2008 | Vadi |
| 7,479,418 B2 | 1/2009 | Cai et al. |
| 7,514,766 B2 | 4/2009 | Yoshida |
| 7,535,744 B2 | 5/2009 | Okuda |

(Continued)

FOREIGN PATENT DOCUMENTS

JP    2004207749    7/2004

OTHER PUBLICATIONS

International Search Report and Written Opinion of the ISA dated Oct. 23, 2012—International Application No. PCT/US2012/028987.

(Continued)

*Primary Examiner* — Matthew W Such
*Assistant Examiner* — Monica D Harrison
(74) *Attorney, Agent, or Firm* — Robert R. Williams

(57) ABSTRACT

A semiconductor chip has an independently voltage controlled silicon region that is a circuit element useful for controlling capacitor values of eDRAM trench capacitors and threshold voltages of field effect transistors overlying the independently voltage controlled silicon region. A bottom, or floor, of the independently voltage controlled silicon region is a deep implant of opposite doping to a doping of a substrate of the independently voltage controlled silicon region. A top, or ceiling, of the independently voltage controlled silicon region is a buried oxide implant in the substrate. Sides of the independently voltage controlled silicon region are deep trench isolation. Voltage of the independently voltage controlled silicon region is applied through a contact structure formed through the buried oxide.

6 Claims, 6 Drawing Sheets

(56) References Cited

U.S. PATENT DOCUMENTS

| | | | |
|---|---|---|---|
| 7,551,019 | B2 | 6/2009 | Fujita et al. |
| 7,573,317 | B2 | 8/2009 | Lewis et al. |
| 7,629,233 | B2 | 12/2009 | Bernstein et al. |
| 7,675,317 | B2 | 3/2010 | Perisetty |
| 7,687,365 | B2 | 3/2010 | Sleight |
| 7,795,044 | B2 | 9/2010 | Wickramasinghe et al. |
| 8,525,245 | B2 * | 9/2013 | Erickson et al. ............... 257/301 |
| 2001/0026990 | A1 * | 10/2001 | Christensen et al. ......... 438/407 |
| 2003/0094654 | A1 | 5/2003 | Christensen et al. |
| 2006/0234428 | A1 | 10/2006 | Furukawa et al. |
| 2007/0189051 | A1 | 8/2007 | Okuda |
| 2009/0108314 | A1 | 4/2009 | Cai et al. |
| 2009/0204777 | A1 | 8/2009 | Norman |
| 2009/0236683 | A1 * | 9/2009 | Williams et al. ............... 257/510 |
| 2010/0032728 | A1 | 2/2010 | Hao et al. |
| 2010/0067319 | A1 | 3/2010 | Aipperspach et al. |
| 2010/0133607 | A1 | 6/2010 | Mouli |
| 2010/0189262 | A1 | 7/2010 | Ducharme et al. |
| 2011/0018094 | A1 | 1/2011 | Chapman et al. |
| 2011/0122694 | A1 | 5/2011 | Modave et al. |

OTHER PUBLICATIONS

"SOI-DRAM circuit technologies for low power high speed multigiga scale memories" bt Kuge, S.; Morishita, F.; Tsuruda, T.; Tomishima, S.; Tsukude, M.; Yamagata, T.; Arimoto, K.; Solid-State Circuits, IEEE Journal vol. 31, Issue: 4, Publication Year: 1996, pp. 586-591 Digital Object Identifier: 10.1109/4.499736.

"Optimal body bias selection for leakage improvement and process compensation over different technology generations" by Cassondra Neau, Kaushik Roy ISLPED '03: Proceedings of the 2003 international symposium on Low power electronics and design; Aug. 2003, pp. 116-121 ACM 1-58113-682-X/03/0008.

"Implementing Temporary Disable Function of Protected Circuitry by Modulating Threshold Voltage of Timing Sensitive Circuit" by Karl R. Erickson et al., U.S. Appl. No. 13/091,243.

"Implementing eFUSE Circuit With Enhanced eFUSE Blow Operation" by Karl R. Erickson et al., U.S. Appl. No. 13/091,259.

"eDRAM Having Dynamic Retention and Performance Tradeoff" by Karl R. Erickson et al., U.S. Appl. No. 13/091,292.

* cited by examiner

Deep Implant of N+

Buried Oxide Implant

Deep Trench Isolation

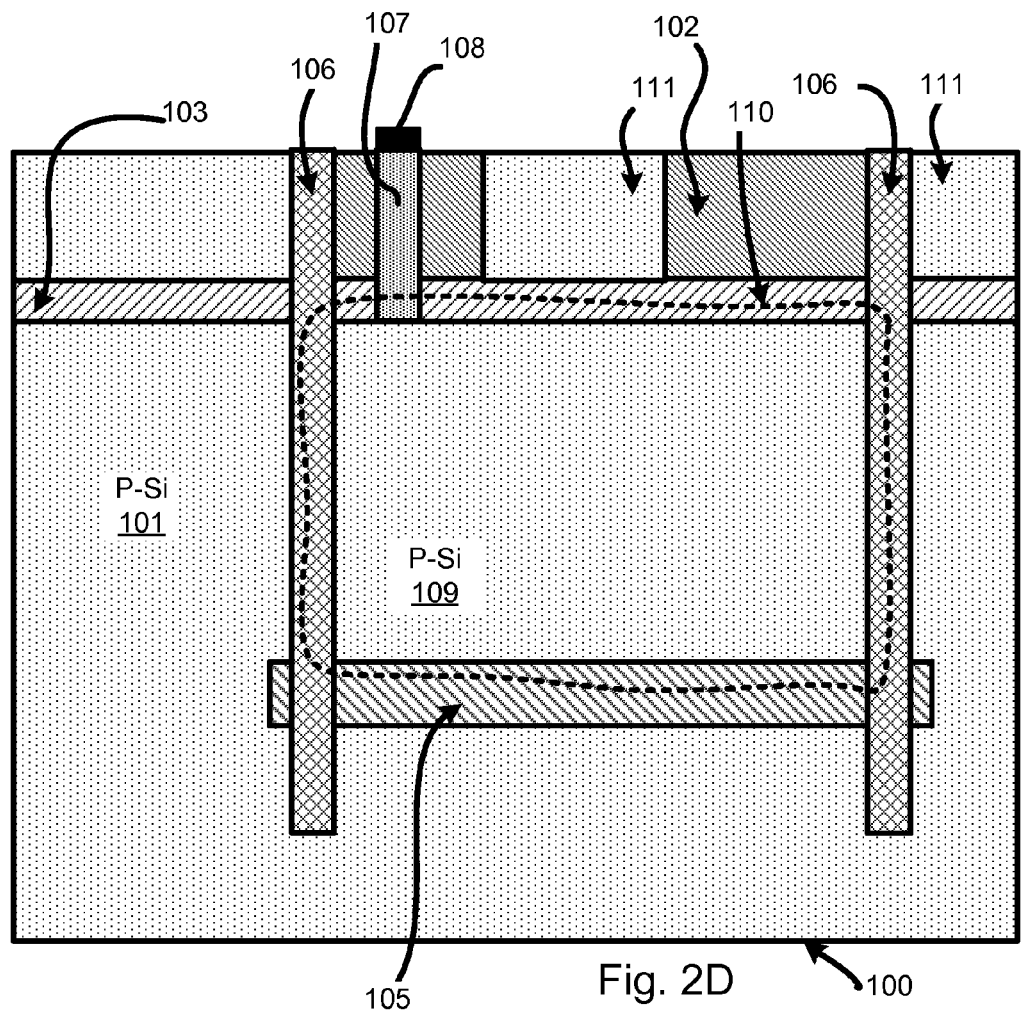
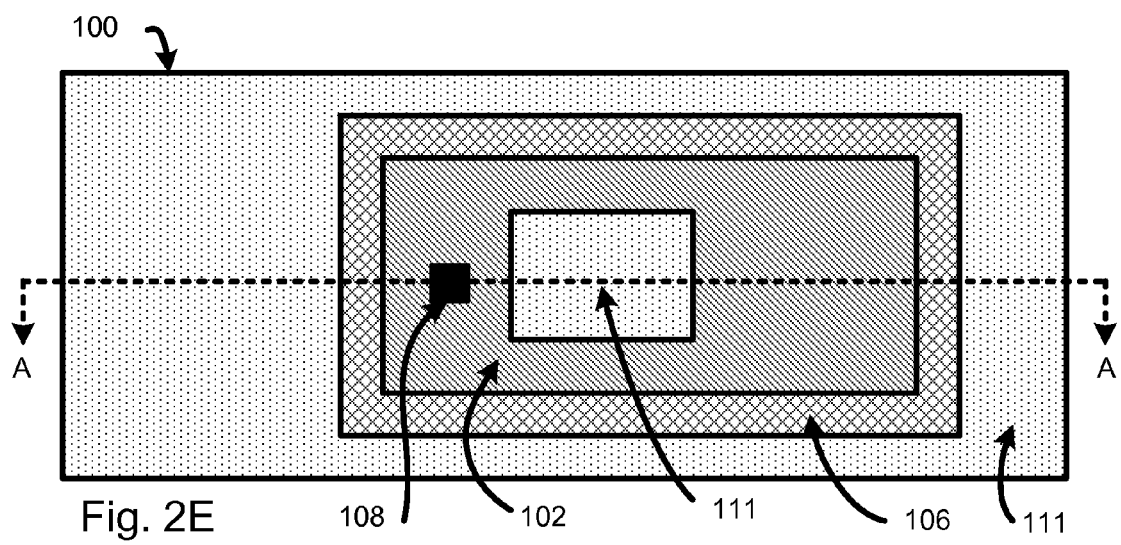

US 8,816,470 B2

INDEPENDENTLY VOLTAGE CONTROLLED VOLUME OF SILICON ON A SILICON ON INSULATOR CHIP

FIELD OF THE INVENTION

This invention relates generally to semiconductor chips, and more specifically to creation of an independently voltage controlled volume of silicon on an SOI (silicon on insulator) semiconductor chip.

SUMMARY OF EMBODIMENTS OF THE INVENTION

An SOI chip has a substrate that is typically P− doped silicon, although substrates of opposite doping (i.e., N−) are also known. A buried oxide (BOX) layer may be implanted to isolate a circuit area above the BOX layer from the underlying substrate portion. The underlying substrate portion is typically connected to a voltage source (e.g., Gnd). Above the BOX, the circuit area may contain STI (shallow trench isolation) regions, source/drain implants for FETs (Field Effect Transistors), body regions under FET gate structures for the FETs, contacts, and wiring to interconnect the FETs.

In an embodiment of the invention, an independently voltage controlled silicon region is created as a circuit element. A bottom of the independently voltage controlled silicon region is created with a deep implant to create an N region when the substrate is doped P−. Sides of the independently voltage controlled silicon region are formed with deep trench isolation, thereby insulating the independently voltage controlled silicon region on all sides (e.g., four sides if the independently voltage controlled silicon region is square or rectangular). A buried oxide region (BOX) forms a top surface of the independently voltage controlled silicon region, thereby completing electrical isolation of the independently voltage controlled silicon region. An electrical contact is formed through the BOX, and through any STI or silicon above the BOX, the electrical contact suitable for connecting the independently voltage controlled silicon region to a voltage or to a logic signal on the chip.

BRIEF DESCRIPTION OF THE DRAWINGS

FIGS. 2A-2E show key process steps in creation of an independently voltage controlled volume of silicon.

DETAILED DESCRIPTION OF THE EMBODIMENTS

In the following detailed description of embodiments of the invention, reference is made to the accompanying drawings, which form a part hereof, and within which are shown by way of illustration specific embodiments by which the invention may be practiced. It is to be understood that other embodiments may be utilized and structural changes may be made without departing from the scope of the invention.

Embodiments of the present invention provide for creation of an independently voltage controlled volume of silicon which is a circuit element generally useful for providing selectable control of leakage/performance characteristics of an eDRAM (embedded dynamic random access memory) on a silicon chip, as well as providing threshold control of other circuits.

Figure 1:
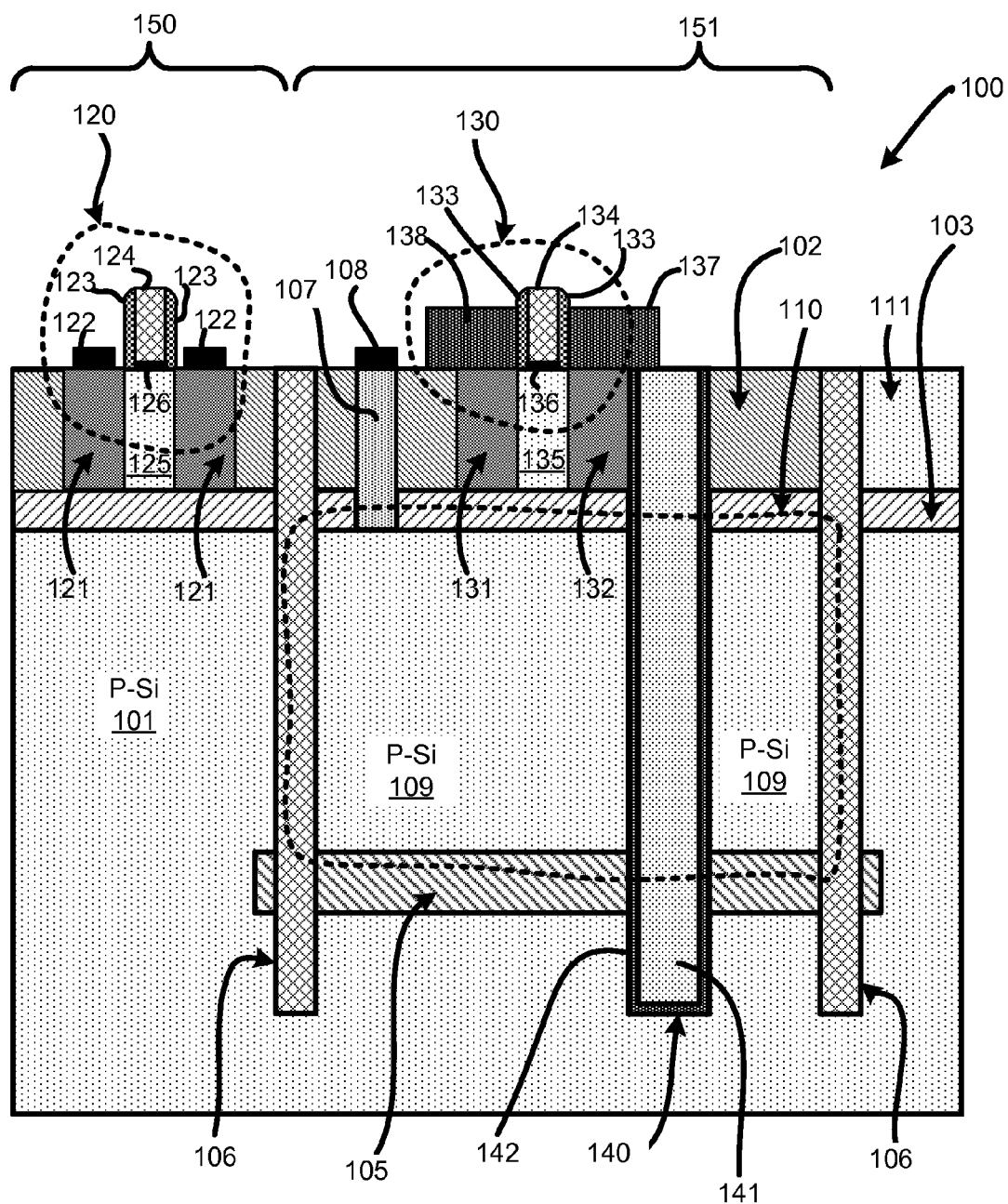
FIG. 1 shows a side view of a portion of a semiconductor chip, showing a logic region and an eDRAM region, the eDRAM region including an independently voltage controlled volume of silicon.

A semiconductor silicon on insulator (SOI) chip 100 of FIG. 1 is shown having a logic area 150 and an eDRAM area 151.

Logic area 150 comprises a portion of P− Silicon 101, which is typically connected to ground. A buried oxide (BOX) 103 provides an electric insulator under a logic FET (field effect transistor) 120. Logic FET 120 includes source/drain implants 121, a P− body region 125, a gate dielectric 126, source/drain contacts 122, gate sidewall spacers 123, and a gate 124 that may be electrically coupled to a logic signal or a voltage source. Logic FET 120, having a P− body and N+ source/drain regions is an NFET (N-channel field effect transistor). Typically, PFETs (P-channel field effect transistors) are also created in logic area 150 using known techniques to create an N− body region and P+ source/drain regions. The NFETs and PFETs in logic region 150 are configured to make logic gates (NANDs, NORs, XORs, latches, registers, and the like).

eDRAM area 151 comprises a pass gate NFET 130 to couple a bit line connected to a source/drain implant 131 to a deep trench capacitor 140 under control of a word line coupled to a gate 134. Pass gate NFET 130 includes the gate 134, a gate dielectric 136, source/drain implants 131 and 132, a body 135, a gate dielectric 136, sidewall spacers 133, and epitaxial growths 137 and 138. Deep trench capacitor 140 comprises a conductor 141 in a deep trench. The conductor may be tungsten, doped polysilicon, or other suitable conducting material placed in the deep trench. A dielectric material 142 isolates conductor 141 from P− silicon 101 and P− silicon 109. Dielectric material 142 may be, for examples HfO2 or SiO2, or other suitable dielectric material. Epitaxial growth 137 couples an adjacent source/drain region 132 over an upper portion of dielectric material 142 to make electrical contact between conductor 141 and the adjacent source/drain region 132.

eDRAM area 151 also comprises deep N implant 105, which forms a "floor", or bottom, of independently voltage controlled silicon region 110, indicated by a dotted line in FIG. 1. N implant 105 may be a deep implant of high enough energy to create N implant 105 at a depth in semiconductor chip 100 that is less deep than deep trench isolation 106, as depicted in FIG. 1, but deep enough to include most or all of a portion of deep trench capacitor 140 below BOX 103. For example, over 50% of deep trench capacitor 140 should face P− Si 109. Note that deep trench capacitor 140 need not extend to N implant 105.

A "ceiling", or top, of the independently voltage controlled silicon region 110 is a portion of BOX 103. Sides of the independently voltage controlled silicon region 110 are formed by a deep trench isolation 106, best seen in FIG. 2E in a top view. N implant 105 must be wide enough to ensure that P− silicon 109 is not in electrical contact with P− silicon 101.

A contacting structure 107 is formed by etching through STI (shallow trench isolation) 102 and through BOX 103 and filled with a conductor such as tungsten or doped polysilicon to make electrical connection to P− Si 109. Contacting structure 107 may have a contact 108 to connect to a voltage (voltage source or a logic signal). Except for contacting structure 107, P− silicon 109 is completely isolated, as described above, from P− silicon 101 and circuitry (e.g., pass gate NFET 130) above BOX 103. Contacting structure 107 transfers the voltage placed on contact 108 to P– silicon 109, thereby providing a voltage on independently voltage controlled silicon region 110.

A single NFET pass gate 130 and an associated deep trench capacitor 140 is shown in eDRAM area 151, however it will be appreciated that a large number, perhaps one million or more, NFET pass gates 130 and associated capacitors 140 are typically placed in an eDRAM area 151. Similarly, for simplicity, a single LOGIC FET 120 is shown in logic area 150. However, in modern semiconductor chips 100, one million, or more, FETs 120 may be constructed.

It will also be appreciated that, while NFET pass gate 130 is shown as a switch to charge or discharge deep trench capacitor 140, and to, on reads, cause a charge on deep trench capacitor 140 to affect a bit line voltage, a PFET, with known processing above BOX 103 could also be used as a pass gate.

Figure 2A:
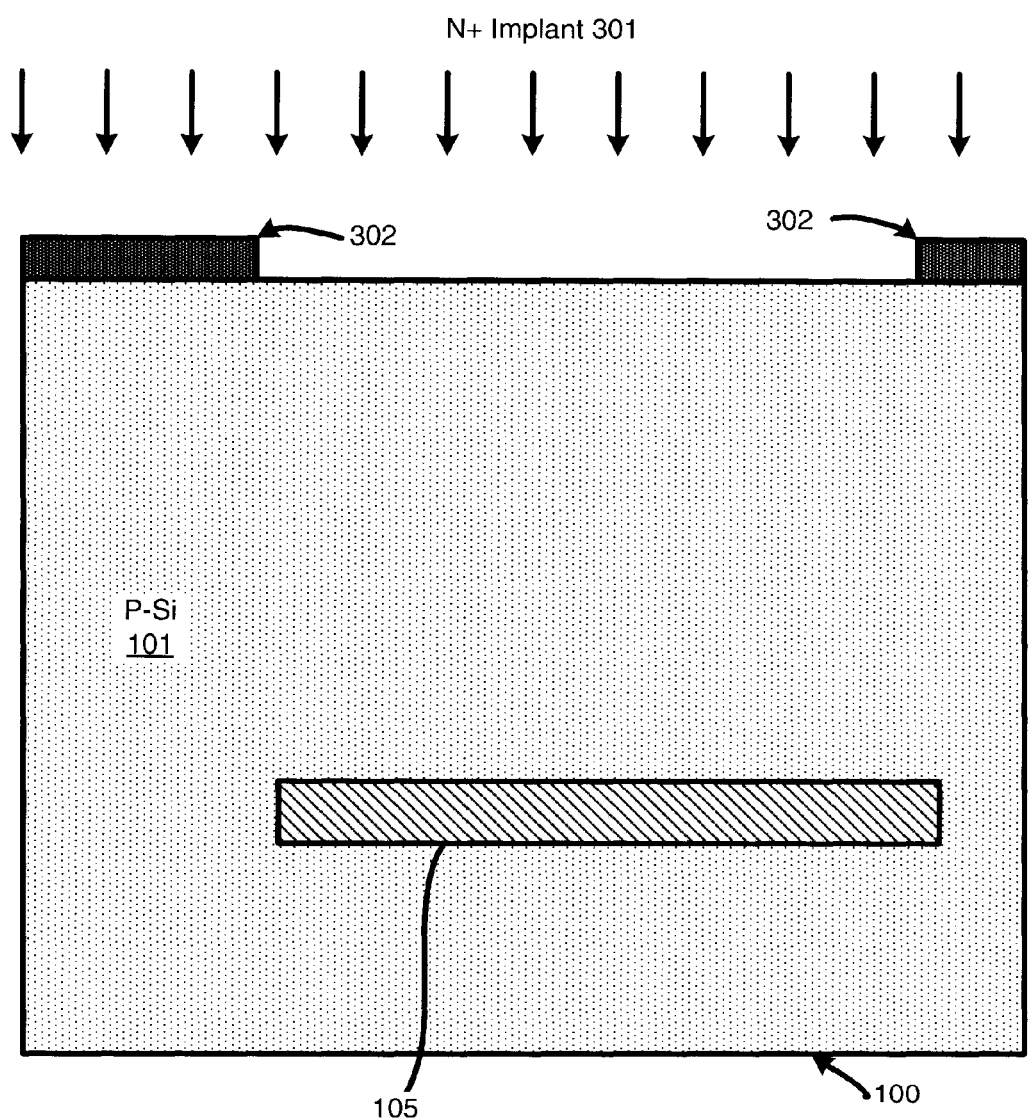

With reference now to FIGS. 2A-2E, a series of key processing steps is shown to create independently voltage controlled silicon region 110. In FIG. 2A, semiconductor chip 100 receives high energy implant 301 through a mask 302, thereby creating N implant 105 at a depth determined by implant energy and semiconductor structure.

Figure 2B:
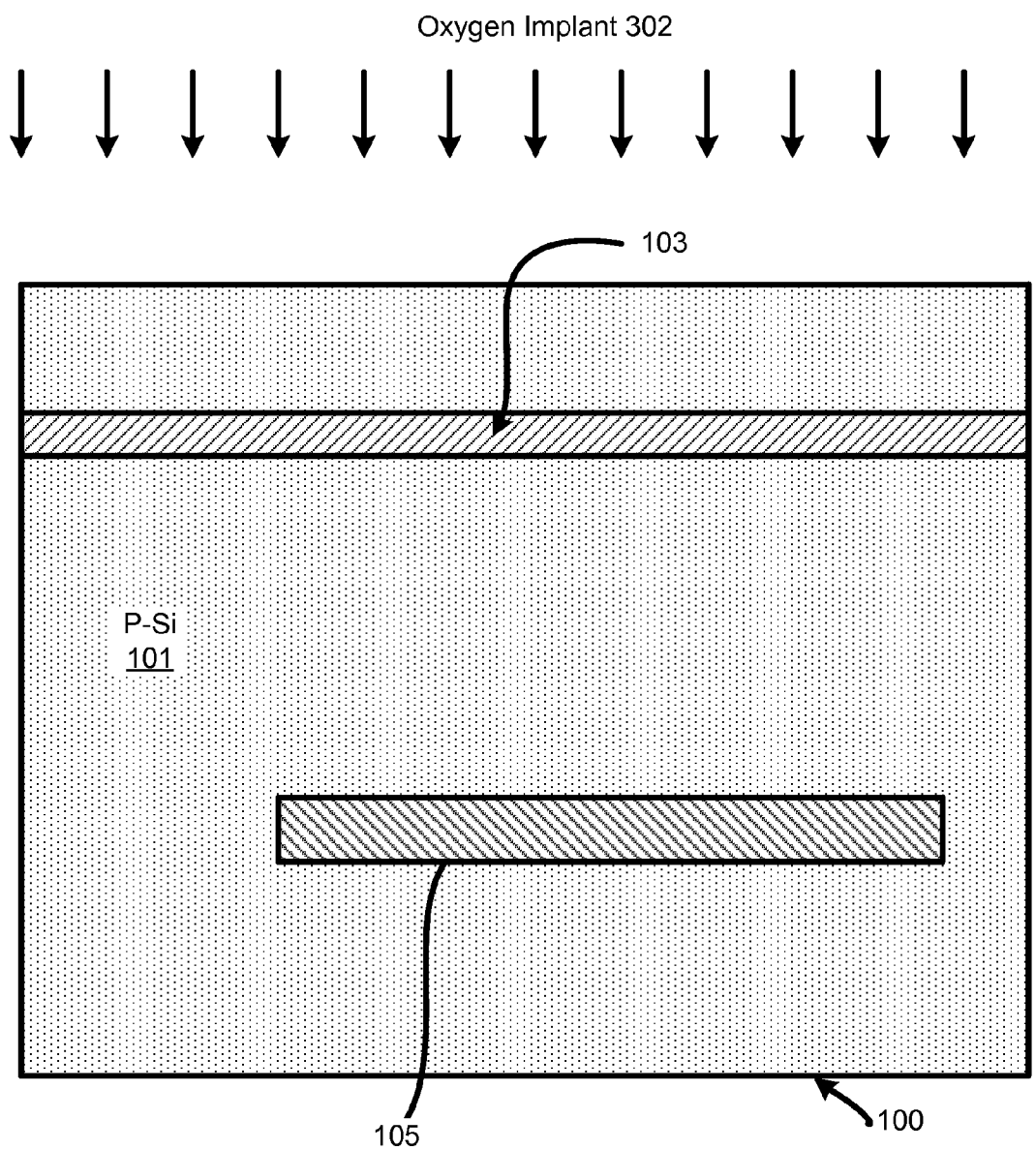

FIG. 2B shows a conventional oxygen implant 303 applied to semiconductor chip 100 to create BOX 103 at a depth determined by energy of the oxygen implant 302.

Figure 2C:
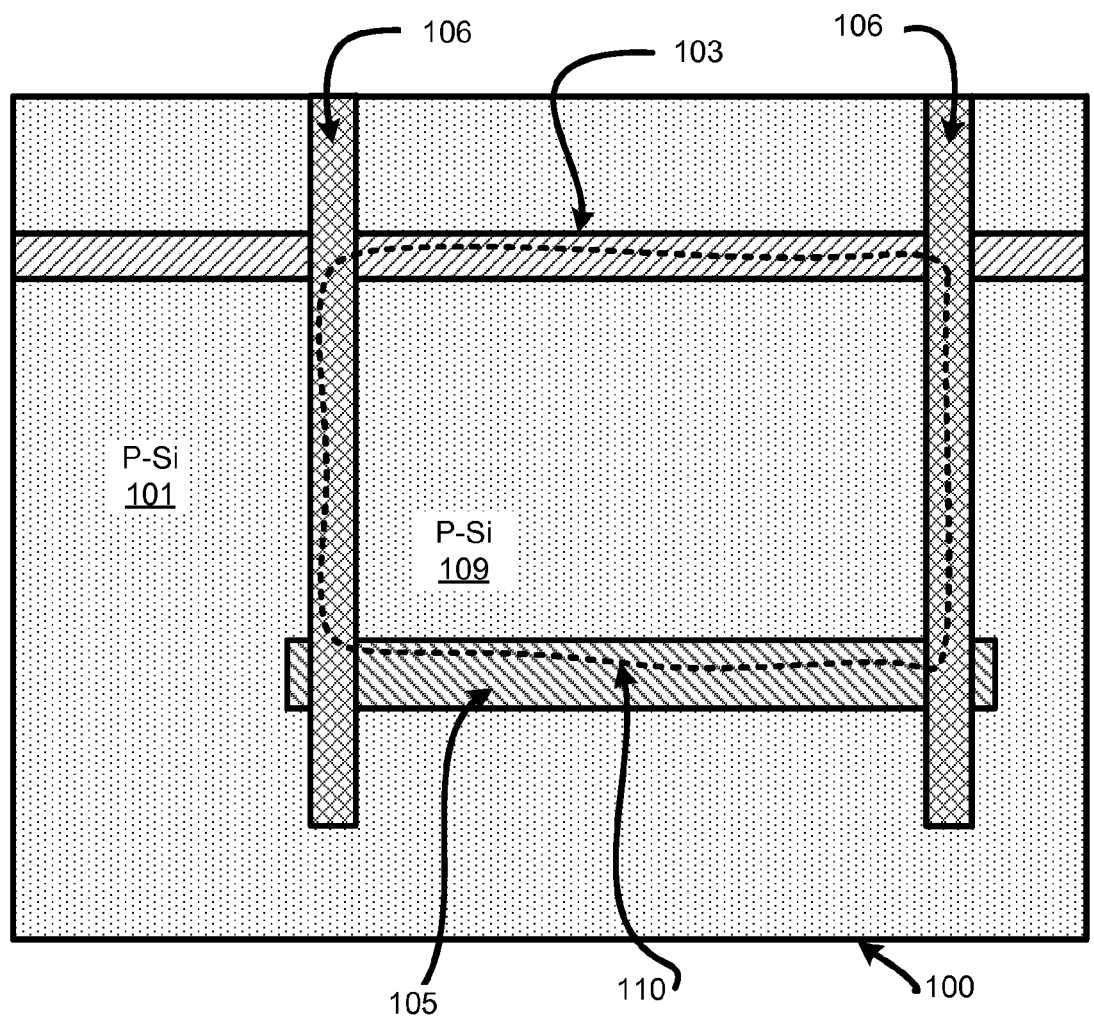

FIG. 2C shows creation of a deep trench isolation 106 that extends at least down to, and advantageously slightly below, N implant 105. Deep trench isolation may be created using a conventional process such as used to create eDRAM capacitors, but is elongated to form sides of the independently voltage controlled silicon region 110. Alternatively, deep trench isolation 106 may utilize a deep trench capacitor structure as taught in copending application US 2011/0018094, also assigned to the present assignee. Following construction of deep trench isolation 106, BOX 103, and N implant 105, P– Si 109 is totally isolated electrically. P– Si 109 is merely an electrically isolated portion of P– Si 101 and does not receive a separate implant.

FIGS. 2D and 2E show, respectively, a cross sectional (through AA) view and a top view of a portion of semiconductor chip 100 generally in the area where independently voltage controlled silicon region 110 is constructed. Shallow trench isolation (STI) 102 is formed in silicon 111 (i.e., the portion of P– Si 101 above BOX 103 as shown in the finely crosshatched portions with crosshatching running up and to the left. Contact structure 107 is created by an oxide etch through STI 102 and BOX 103. A contact 108 may be formed atop contact structure 107. FIG. 2E shows a top view of that portion of semiconductor chip 100. NFET pass gate 130 (FIG. 1) is formed by conventional means in silicon 111 in a conventional manner, creating source/drain implants 131, 132, creation of gate dielectric 136, creation of spacers 133, epitaxial growth 137 and 138 after etching, lining, and filling of deep trench capacitor 140.

Figure 3:
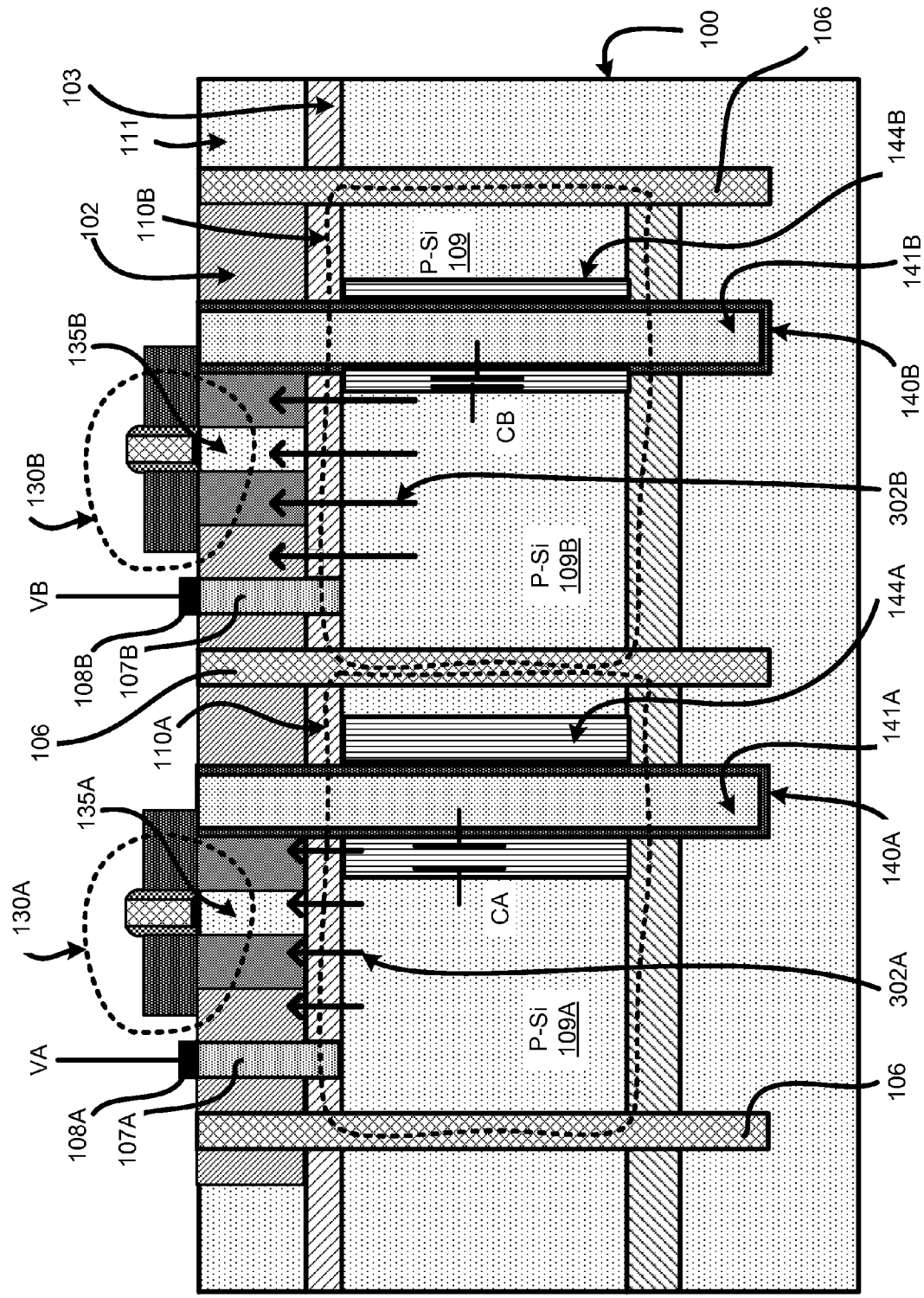
FIG. 3 shows a cross section of a semiconductor chip having two independently voltage controlled volumes, each containing an eDRAM cell.

FIG. 3 shows two independently voltage controlled silicon regions 110, referenced 110A (left instance) and 110B (right instance), with 110A and 110B sharing a common deep trench isolation 106 portion between them, for simplicity of illustration. Key referenced items have an "A" suffix (e.g., 130A for the left hand NFET pass gate 130) for referenced items associated with independently voltage controlled silicon region 110A, and a "B" suffix for referenced items associated with independently voltage controlled silicon region 110B.

In FIG. 3, VA, attached to contact structure 107A with contact 108A may have a voltage of 0.0 volts, thereby causing P– Si 109A to be at 0.0 volts. VB, attached to contact structure 107B with contact 108B may have a voltage of +5.0 volts, thereby causing P– Si 109B to be at 5.0 volts. Width of charge depletion regions 144 (144A, 144B) around deep trench capacitor 140 (140A, 140B) is dependent on voltage between a voltage on conductor 141 (141A, 141B) and a voltage applied to P– Si 109 (109A, 109B). To a first order, separation of capacitor plates of capacitor C (CA, CB) correspond to width of the charge depletion region. It will be understood that deep trench capacitor 140 is schematically shown as capacitor C. Deep trench capacitor 140A is shown schematically as CA; deep trench capacitor 140B is shown schematically as capacitor CB. If the charge depletion region 144 (144A, 144B in FIG. 3) is wider, the capacitor plates are further apart, and the capacitance is less. Using the VA, VB voltages assumed, independently voltage controlled silicon region 110A will have a wider charge depletion region 144A around deep trench capacitor 140A than a width of charge depletion region 144B in independently voltage controlled silicon region 110B around deep trench capacitor 140B. Therefore, CA is shown has having capacitor plates further apart than CB. CA will have less capacitance than CB.

Another effect of the voltage (VA, VB) placed on P– Si 109A, 109B is that an electric field 302 (302A, 302B) passes through BOX 103 and affects threshold voltages of overlying FETs, such as NFET pass gates 130A, 130B. As shown, with the assumed values of VA, VB, electric field 302A is less than electric field 302B.

In terms of controlling characteristics of eDRAM cells in P– Si 109A, threshold voltage of NFET pass gate 130A will be higher than a threshold voltage of NFET pass gate 130B, thereby significantly lowering leakage of NFET pass gate 130A relative to NFET pass gate 130B. Capacitance of CA, as explained earlier is less than CB, but significantly reduced leakage from CA through NFET pass gate 130A versus leakage from CB through NFET pass gate 130B will cause retention of data in deep trench capacitor 140A (i.e., CA) to be longer than retention of data in deep trench capacitor 140B (i.e., CB) even though CB is a larger capacitance. Therefore, eDRAMs may be controlled to leak more or less by control of voltage applied to the associated P– Si 109 in independently voltage controlled silicon region 110. This leakage control capability is very desirable in low power modes of an eDRAM.

For performance, such as read speed, however, the eDRAM in independently voltage controlled silicon region 110B will be superior (faster) versus the eDRAM in independently voltage controlled silicon region 110A. NFET pass gate 130B, having a lower threshold voltage will conduct more strongly. Also, the larger capacitance of CB will pull a bit line down faster and further through NFET pass gate 130B than the lesser capacitance and less conductive structure associated with independently voltage controlled silicon region 110A. Therefore, eDRAMs may be controlled to operate faster (or slower) by control of the associated P– Si 109 in independently voltage controlled silicon region 110.

Applying the electric field 302 and capacitor C to FIG. 1 which has a logic area 150 as well as an eDRAM area 151, it is clear that a voltage applied to P– Si 109 is not going to affect a threshold voltage in LOGIC FET 120, since LOGIC FET 120 is constructed over P– Si 101, which is at Gnd, rather than being constructed over a P– Si 109. It is of course true that P– Si 101 can be connected to a voltage source other than ground, and thereby affect threshold voltage of any FET overlying that biased P– 101, however, doing so would affect PFETs and NFETs in an opposite manner (for example, PFET strength would decrease when NFET strength increases) and therefore, it would be undesirable to do so. Embodiments of the current invention provide for one or more independently voltage controlled silicon regions on a semiconductor chip. PFET/NFET relative strength in eDRAM applications is not an issue, since the eDRAM regions 151 typically contain only NFETs (i.e., NFET pass gates 130).

What is claimed is:

1. A semiconductor chip comprising:
    a substrate having a first doping type;
    an independently voltage controlled silicon region having the first doping type;
    the independently voltage controlled silicon region comprising:
        a deep implant having a second doping type of opposite doping to the first doping type, the deep implant forming a bottom of the independently voltage controlled silicon region;
        a buried oxide implant forming a top of the independently voltage controlled silicon region;
        a deep trench isolation forming sides of the independently voltage controlled silicon region; and
    a contact structure of electrically conducting material formed through the buried oxide to provide electrical contact to the independently voltage controlled silicon region.

2. The semiconductor chip of claim 1, wherein the contact structure couples the independently voltage controlled silicon region to a voltage supply.

3. The semiconductor chip of claim 1, wherein the contact structure couples the independently voltage controlled silicon region to a logic signal.

4. A method for creating an independently voltage controlled silicon region having a first doping type in a semiconductor chip having the first doping type comprising:
    creating a deep implant of a second doping type opposite doping to the first doping type;
    creating a buried oxide (BOX) in the semiconductor chip, the deep implant being entirely under the BOX;
    creating a deep trench isolation at least as deep in the substrate as the deep implant and intersecting both the deep implant and the BOX;
    the deep implant forming a bottom of the independently voltage controlled silicon region;
    the BOX forming a top of the independently voltage controlled silicon region;
    the deep trench isolation forming walls of the independently voltage controlled silicon region, thereby completely isolating the independently voltage controlled silicon region from a remainder of the substrate; and
    creating a contact structure to electrically connect the independently voltage controlled silicon region to a contact.

5. The method of claim 4 further comprising connecting the contact to a voltage source.

6. The method of claim 4 further comprising connecting the contact to a logical signal.

* * * * *